(12) United States Patent
Choi et al.

(10) Patent No.: US 8,203,674 B2
(45) Date of Patent: Jun. 19, 2012

(54) MANUFACTURING THIN FILM TRANSISTOR ARRAY PANELS FOR FLAT PANEL DISPLAYS

(75) Inventors: Seung-Ha Choi, Siheung-si (KR); Min-Seok Oh, Yongin-si (KR); Jeong-Min Park, Seoul (KR); Doo-Hee Jung, Seoul (KR); Hi-Kuk Lee, Yongin-si (KR); Sang-Gab Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/179,436

(22) Filed: Jul. 8, 2011

(65) Prior Publication Data

US 2011/0269253 A1 Nov. 3, 2011

Related U.S. Application Data

(62) Division of application No. 12/220,145, filed on Jul. 22, 2008, now Pat. No. 8,004,636.

(30) Foreign Application Priority Data

Oct. 4, 2007 (KR) .................. 10-2007-0099888

(51) Int. Cl.
*G02F 1/1333* (2006.01)
*G02F 1/136* (2006.01)
*G02F 1/1343* (2006.01)

(52) U.S. Cl. .......... 349/110; 349/111; 349/44; 349/139; 349/39

(58) Field of Classification Search .............. 349/44, 349/39, 110–111
See application file for complete search history.

(56) References Cited

U.S. PATENT DOCUMENTS

| 5,339,181 | A | 8/1994 | Kim et al. | |
|---|---|---|---|---|
| 5,708,483 | A | 1/1998 | Asai | |
| 6,975,367 | B2 | 12/2005 | Lim | |
| 2006/0139548 | A1* | 6/2006 | Ahn | ............. 349/141 |
| 2006/0157705 | A1 | 7/2006 | Ki | |

FOREIGN PATENT DOCUMENTS

JP 10-186628 7/1998
(Continued)

OTHER PUBLICATIONS

Patent Abstracts of Japan, Publication No. 10-186628, Jul. 14, 1998, 1 p.
(Continued)

*Primary Examiner* — Wen-Ying P Chen
(74) *Attorney, Agent, or Firm* — Innovation Counsel LLP

(57) ABSTRACT

A thin film transistor array panel for a flat panel display includes a substrate, a first signal line formed on the substrate, a second signal line intersecting and insulated from the first signal line, a switching element having a first terminal connected to the first signal line, a second terminal connected to the second signal line, and a third terminal, a pixel electrode connected to the third terminal of the switching element, and first and second light blocking members extending parallel to the second signal line, each being disposed on an opposite side of and partially overlapping an respective edge of the second signal line, an interval between the first and second light blocking members being in a range of from more than 1.5 µm to less than 4 µm. The array panel prevents light leakage from the display and improves its transmittance, aperture ratio and color reproducibility.

11 Claims, 23 Drawing Sheets

FOREIGN PATENT DOCUMENTS

| | | |
|---|---|---|
| JP | 11-212115 | 8/1999 |
| JP | 2001-36087 | 2/2001 |
| KR | 2001-0017526 | 3/2001 |
| KR | 2006-0020895 | 3/2006 |

OTHER PUBLICATIONS

Patent Abstracts of Japan, Publication No. 11-212115, Aug. 6, 1999, 1 p.

Patent Abstracts of Japan, Publication No. 2001-036087, Feb. 9, 2001, 1 p.

Korean Patent Abstracts, Publication No. 1020010017526, Mar. 5, 2001, 1 p.

Korean Patent Abstracts, Publication No. 1020060020895, Mar. 7, 2006, 1 p.

\* cited by examiner

FIG.22
| | Etch back 35s | Etch back 45s |
|---|---|---|
| After etch back | 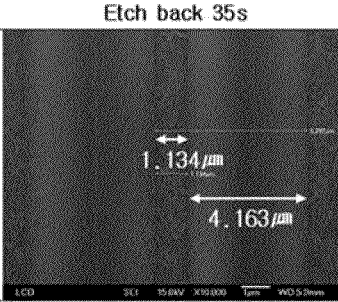 1.134μm 4.163μm | 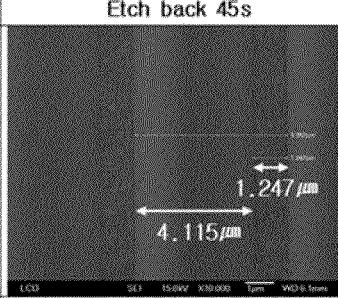 1.247μm 4.115μm |
| A width of the photosensitive film | 4.163μm | 4.115μm |
| An interval between the neighboring photosensitive film | 1.134μm | 1.247μm |
| After wet etch | 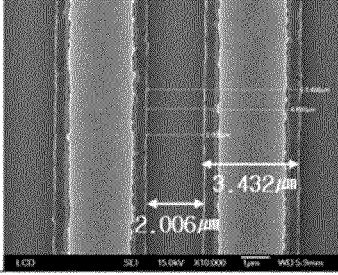 3.432μm 2.006μm | 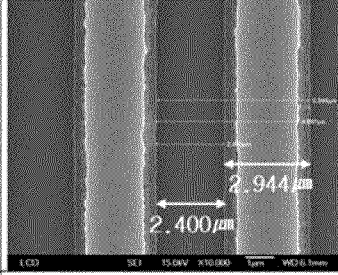 2.944μm 2.400μm |
| A width of the lower light blocking | 3.432μm | 2.944μm |
| An interval between the neighboring lower light blocking | 2.006μm | 2.400μm |

MANUFACTURING THIN FILM TRANSISTOR ARRAY PANELS FOR FLAT PANEL DISPLAYS

RELATED APPLICATIONS

This application is a divisional of U.S. patent application Ser. No. 12/220,145 filed Jul. 21, 2008, which claims priority from Korean Patent Application No. 10-2007-0099888, filed Oct. 4, 2007 in the Korean Intellectual Property Office, the entire disclosure of which are incorporated herein by reference in their entireties.

BACKGROUND (a) Field of the Invention

The present invention relates to display devices, such as liquid crystal displays (LCDs), and methods for manufacturing them. More particularly, the present invention relates to methods for manufacturing flat panel display devices so as to minimize the capacitance between the gate lines and data lines thereof and thereby improve the aperture ratios and prevent light leakage in such devices.

(b) Description of the Related Art

A representative flat display device, for example, an LCD, typically includes two display panels and a layer of a liquid crystal material interposed between the two panels. More particularly, LCDs typically incorporate a structure in which a plurality of pixel electrodes are arranged in a matrix shape on one of the two panels, and a common electrode and light blocking member for blocking light covers the entire surface of the other panel.

The typical LCD includes field generating electrodes and thin film transistors connected thereto, a plurality of pixels arranged in a matrix shape, and a plurality of signal lines for transmitting signals thereto. The signal lines include gate lines for transmitting scanning signals and data lines for transmitting data signals, and each pixel has associated with it a respective field generating electrode, a thin film transistor and a color filter for displaying a color.

The gate lines include gate electrodes and the data lines include source and drain electrodes. The pixel electrodes and associated thin film transistors are disposed on one of the two display panels, and this panel is generally referred to as a thin film transistor array panel. The common electrode and the light blocking member are typically provided on the other panel, and this panel is generally referred to as a common electrode panel. The light blocking member typically has a plurality of openings respectively corresponding to the pixels, and if the openings and the pixel electrodes are not properly aligned when the two display panels are combined, light leakage may be generated such that the display exhibits horizontal stripes and/or longitudinal stripes, thereby deteriorating picture quality.

In a conventional display, the area of the light blocking member defining the regions between the pixels is made sufficiently wide to accommodate a margin for misalignment, so as to prevent the leakage of light. However, as a result, the aperture ratio and light transmittance of the display device are undesirably diminished.

BRIEF SUMMARY

In accordance with the present invention, novel display devices are provided which have improved aperture ratios and light transmittance, and in which light leakage is prevented, together with methods for manufacturing such displays.

In one exemplary embodiment, a thin film transistor array panel includes a substrate; a first signal line formed on the substrate; a second signal line intersecting the first signal line and insulated from the signal line; a switching element having a first terminal connected to the first signal line, a second terminal connected to the second signal line, and a third terminal; a pixel electrode connected to the third terminal of the switching element; and first and second light blocking members extending parallel to the second signal line, each light blocking member being disposed on an opposite side of and partially overlapping a corresponding opposite edge of the second signal line, wherein the interval between the first and second light blocking members is in a range of from more than 1.5 µm to less than 4 µm.

The first and second light blocking members may have respective widths of from about 2.5 µm to about 5 µm, and the width of the respective overlaps between the first and second light blocking members and the second signal line may be in a range of from about 1.25 µm to about 2.5 µm.

Each of the first and second light blocking members may have a portion that does not overlap the second signal line, and the width of each non-overlapping portion may be in a range of from about 1.25 µm to about 2.5 µm. The first signal line may be a gate line and the second signal line may be a data line, wherein the gate line may include first and second stems disposed parallel to each other, and the first light blocking member and the second light blocking member may connect the first stem and the second stem to each other.

The panel may include a first passivation layer formed on the switching element, a color filter formed on the first passivation layer, and a second passivation layer formed on the color filter, and the pixel electrode may be disposed on the second passivation layer.

The width of the overlap of the first light blocking member and the second light blocking member, and the second signal line, respectively, may be in a range of 1.25 µm to 2.5 µm, and the exposed width of the first light blocking member and the second light blocking member from the second signal line may be in a range of 1.25 µm to 2.5 µm.

The first signal line may be a gate line and the second signal line may be a data line, wherein the gate line may include first and second stems disposed parallel to each other, and the first light blocking member and the second light blocking member may connect the first stem and the second stem to each other.

The thin film transistor array panel may further include a first passivation layer formed on the switching element, a color filter formed on the first passivation layer, and a second passivation layer formed on the color filter, and the pixel electrode may be disposed on the second passivation layer.

The first signal line may be a gate line and the second signal line may be a data line, and the gate line may include first and second stems disposed parallel to each other, and the first light blocking member and the second light blocking member may connect the first stem and the second stem to each other.

The thin film transistor array panel may further include a first passivation layer formed on the switching element, a color filter formed on the first passivation layer, and a second passivation layer formed on the color filter, and the pixel electrode may be disposed on the second passivation layer.

In another exemplary embodiment, a method for manufacturing a thin film transistor array panel includes forming a metal layer on a substrate, coating a photosensitive film on the metal layer, exposing and developing the photosensitive film using a predetermined light mask to form a first photosensitive film pattern including a first portion, a second portion thinner than the first portion, and a third portion thinner than the second portion, removing a portion of the second and third portions by etching back the first photosensitive film pattern to form a secondary photosensitive film pattern exposing a portion of the metal layer below the second and third portions, and etching the metal layer using the secondary photosensitive film pattern as an etch mask to form a first light blocking member and a second light blocking member, the first light blocking member and the second light blocking member being disposed parallel to each other with a predetermined interval disposed therebetween.

The width of the space between the exposed portion and the secondary photosensitive film pattern, which is formed by the removal of the second portion of the first photosensitive film among the metal layer, may be in a range of more than 1 μm to less than 4 μm.

The predetermined light mask for the formation of the first photosensitive film pattern may include a light blocking region, a light transmitting region, and a translucent region, and the translucent region may include a first slit region and a second slit region, the width of the slits of the first slit region being uniform, and the respective widths of the slits of the second slit region may gradually increase in proportion to their respective distance from the light blocking region.

The interval between the first light blocking member and the second light blocking member may be in a range of from more than 1.5 μm to less than 4 μm, and the widths of the first light blocking member and the second light blocking member may be in a range of from about 2.5 μm to about 5 μm.

The exemplary method may further include forming a first insulating layer on the first light blocking member and the second light blocking member, forming a data line partially overlapping the first light blocking member and the second light blocking member on the first insulating layer, forming a second insulating layer on the data line, and forming a color filter on the second insulating layer.

In another exemplary embodiment, a method for manufacturing a thin film transistor array panel includes forming a metal layer on a substrate; coating a photosensitive film on the metal layer; exposing and developing the photosensitive film using a predetermined light mask to form a first photosensitive film pattern including a first portion and a second portion thinner than the first portion, and partially exposing the metal layer; etching back the first photosensitive film pattern to remove the second portion and form a secondary photosensitive film pattern exposing a portion of the metal layer below the second portion; etching the metal layer using the secondary photosensitive film pattern as an etch mask to form a first light blocking member, a second light blocking member, and a gate line, the first light blocking member and the second light blocking member being disposed parallel to each other with a predetermined interval disposed therebetween; forming a gate insulating layer on the gate line; forming a semiconductor on the gate insulating layer; forming a data line partially overlapping the first light blocking member and the second light blocking member on the semiconductor; forming a first passivation layer on the data line; forming a color filter on the passivation layer; forming a second passivation layer on the color filter; and forming a pixel electrode on the second passivation layer.

In accordance with the present invention, the lower light blocking members are formed on opposite sides of a corresponding data line such that leakage of light at the peripheral edges of the data line is prevented, thereby improving the display quality. Also, the area of the upper light blocking member is reduced such that the aperture ratio and the light transmittance of the display are improved, and its costs correspondingly reduced.

A better understanding of the above and many other features and advantages of the novel display panels and methods for making them of the present invention may be obtained from a consideration of the detailed description thereof below, particularly if such consideration is made in conjunction with the several views of the appended drawings, wherein like elements are referred to by like reference numerals throughout.

BRIEF DESCRIPTION OF THE DRAWINGS

FIG. 22 is an electron microscopy picture depicting the results of the data listed in Table 1 hereof; and, FIG. 23 is a partial cross-sectional view of an LCD manufactured in accordance with an exemplary embodiment of a method of the present invention.

DETAILED DESCRIPTION

Figure 1:
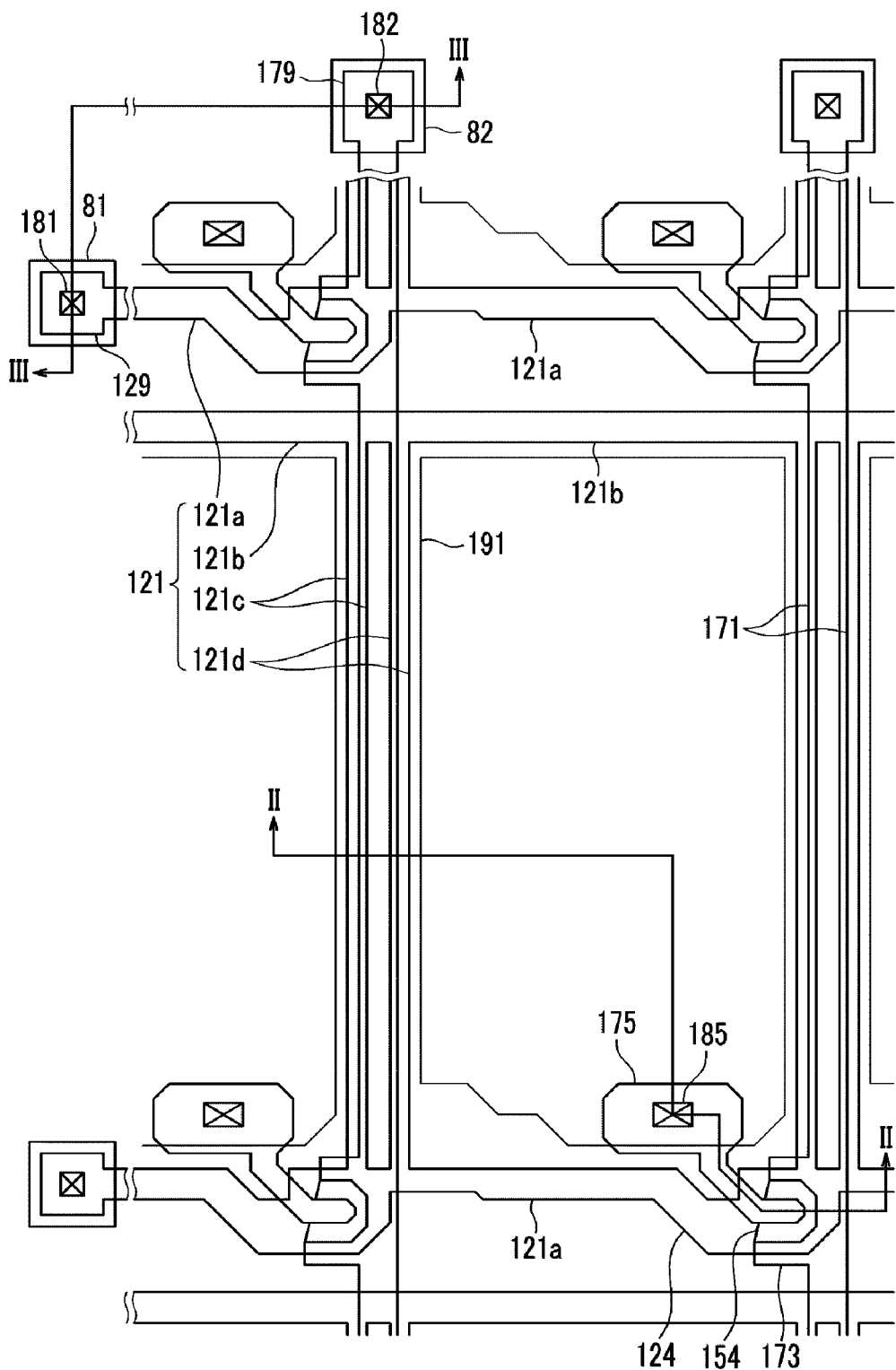
FIG. 1 is a partial top plan view of an exemplary embodiment of a thin film transistor array panel for an LCD in accordance with the present invention, showing a single exemplary pixel area thereof.

The present invention is described more fully hereinafter with reference to the accompanying drawings, in which exemplary embodiments of the invention are illustrated. However, as those of skill in this art will appreciate, the embodiments described herein may be modified in various different ways, all without departing from the spirit or scope of the present invention.

In the drawings, the thickness of layers, films, panels, regions, and the like, are exaggerated for clarity. Also, it should be understood that when an element, such as a layer, film, region, or substrate, is described as being "on" another element, it can be disposed directly on the other element, or alternatively, one or more intervening elements may also be present. In contrast, when an element is referred to as being "directly on" another element, this is to convey that there are no intervening elements present between the two elements.

Figure 2:
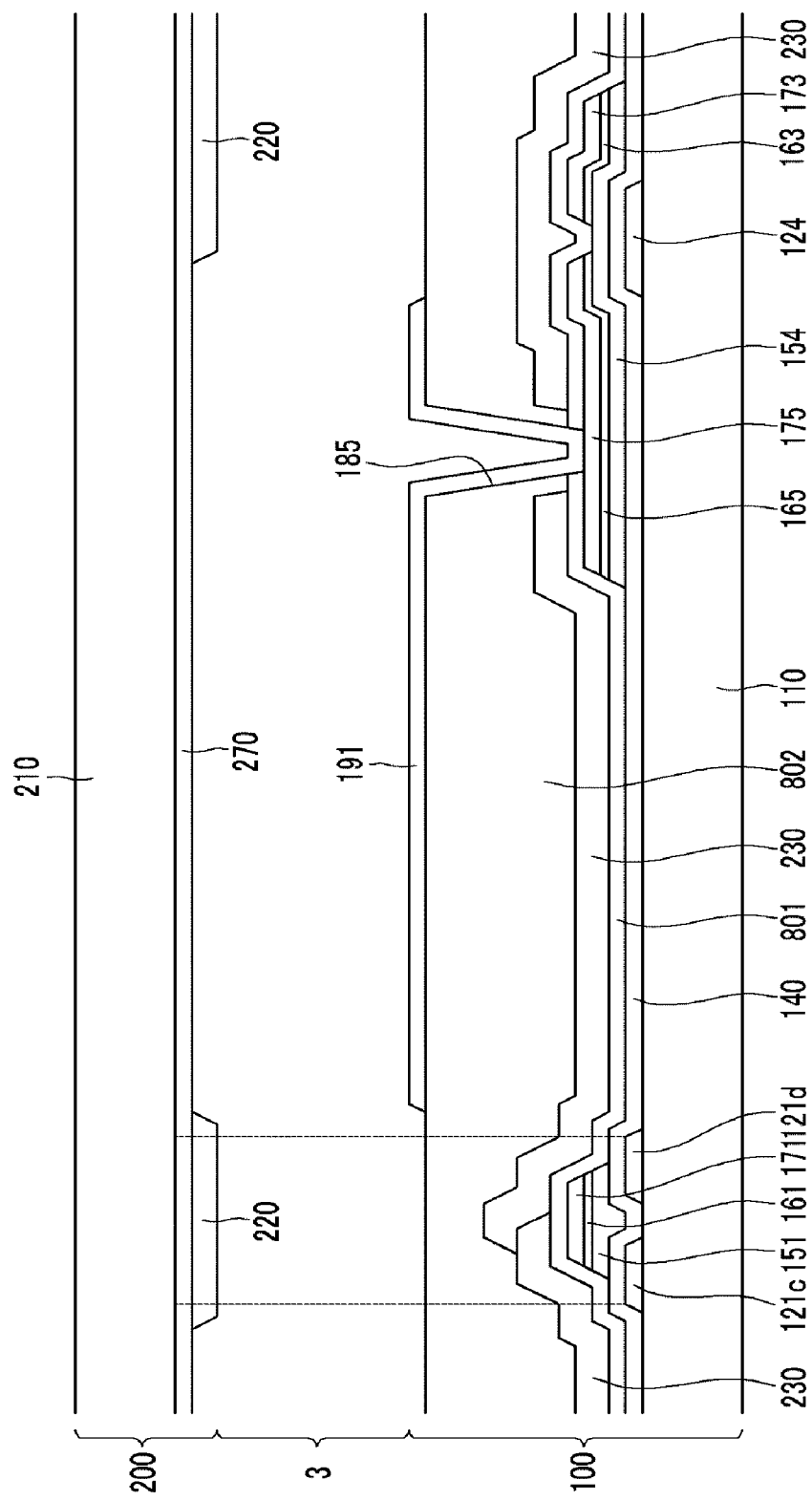
FIG. 2 is a partial cross-sectional view of the exemplary LCD thin film transistor array panel of FIG. 1, as seen along the lines of the section II-II taken therein, and showing an associated common electrode panel of the LCD.
Figure 3:
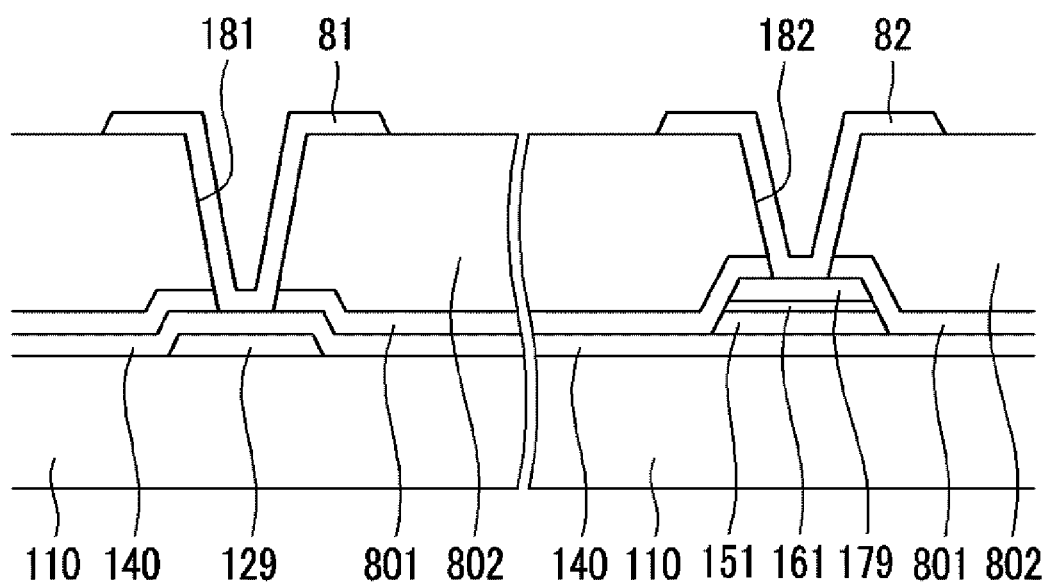
FIG. 3 is a partial cross-sectional view of the exemplary LCD thin film transistor array panel of FIG. 1, as seen along the lines of the section III-III taken therein.

An exemplary embodiment of an LCD in accordance with the present invention is described in detail below with reference to FIG. 1 to FIG. 3, wherein FIG. 1 is a partial top plan view of an exemplary embodiment of a thin film transistor array panel 100 for an LCD in accordance with the present invention, showing a single exemplary pixel area thereof, FIG. 2 is a partial cross-sectional view of the exemplary LCD thin film transistor array panel of FIG. 1, as seen along the lines of the section II-II taken therein, and showing an associated common electrode panel 200 of the LCD, and FIG. 3 is a partial cross-sectional view of the exemplary LCD thin film transistor array panel 100 of FIG. 1, as seen along the lines of the section III-III taken therein.

The thin film transistor array panel 100 is described in detail first. As illustrated in FIGS. 1 to 3, a plurality of gate lines 121 are formed on an insulating substrate 110. The gate lines 121 transmit gate signals and extend substantially in a transverse direction, and include stems 121a and 121b that also extend in the transverse direction, and lower light blocking members 121c and 121d that extend vertically from the stems 121a and 121b for connecting neighboring stems 121a and 121b to each other and for blocking light leakage generated at the circumference of data lines 171. Each of the gate lines 121 includes a plurality of gate electrodes 124 projecting down-ward and an end portion 129 having a large area for making contact with another layer or an external driving circuit. Here, it is preferable that the widths of the lower light blocking members 121c and 121d are in the range of from about 2.5 μm to about 5 μm.

A gate insulating layer 140, preferably made of silicon nitride (SiNx) or silicon oxide (SiOx), is formed on the gate lines 121.

A plurality of semiconductor stripes 151, preferably made of amorphous silicon, is formed on the gate insulating layer 140. The semiconductor stripes 151 extend substantially in the longitudinal direction and include a plurality of island-shaped projections 154 branching out toward the gate electrodes 124. However, in an alternative embodiment, the semiconductors may be formed only with portions corresponding to the island-shaped protrusions 154.

A plurality of ohmic contacts 161, 163 and 165 are formed on the semiconductor stripes 151. The ohmic contacts 161, 163 and 165 are preferably made of n+ hydrogenated a-Si heavily doped with an N-type impurity, such as phosphorous, or alternatively, they may be made of silicide or polysilicon.

A plurality of data lines 171 and a plurality of drain electrodes 175 are formed on the ohmic contacts 161, 163 and 165 and the gate insulating layer 140.

Each data line 171 includes a plurality of source electrodes 173 projecting toward the gate electrodes 124 that are curved like a crescent, and include an end portion 179 having a large area for making contact with another layer or an external driving circuit. The data lines 171 may have a width in the range of from about 2.5 μm to about 9 μm. As illustrated in FIG. 1, the side edges of these data lines 171 respectively overlap a corresponding one of the lower light blocking members 121c and 121d.

The bar-shaped lower light blocking members 121c and 121d are disposed on opposite sides of the data lines 171, and the edges of the lower light blocking members 121c and 121d and opposite edges of the data lines 171 respectively overlap each other so as to prevent light leakage at the edges of the data lines 171. The light blocking members 121c and 121d may also have various other shapes and arrangements, depending on the shapes of the data lines 171 or pixel electrodes 191. For example, when the data lines are curved, the light blocking members 121c and 121d may then also have a curved structure corresponding to that of the data lines 171, and when the edges of the pixel electrodes 191 adjacent to the data lines 171 protrude or are recessed, the edges of the lower light blocking member 121c and 121d may also protrude or be recessed correspondingly.

As illustrated in FIG. 2, it is preferable that the lower light blocking members 121c and 121d disposed on opposite sides of a data line 171 are spaced apart from each other at an interval of from about 1.5 μm to about 4 μm, and that they respectively overlap a corresponding edge of the data line 171 by about 1.25 μm to about 2.5 μm.

Generally, a signal delay is generated by a time constant that is determined by the product of the resistance of the data line 171 and the parasitic capacitance Cgd generated by the overlap between the data line 171 and the lower light blocking members 121c and 121d. The amount of the parasitic capacitance Cgd is proportional to the area of overlap of the data line 171 and the lower light blocking members 121c and 121d. On the other hand, when the amount of overlap of the data line 171 and the lower light blocking members 121c and 121d is reduced substantially in order to reduce this parasitic capacitance, misalignment between the signal lines may result in gaps between the data lines 171 and the corresponding lower light blocking members 121c and 121d, and these gaps may result in the undesirable leakage of light from the display.

Accordingly, in accordance with the present invention, the lower light blocking members 121c and 121d respectively overlap an edge of a corresponding data line 171 with overlap widths in the range of from about 1.25 μm to about 2.5 μm, such that the parasitic capacitances Cgd are minimized, and at the same time, signal delay and light leakage are prevented, even if there is some misalignment between the signal lines.

Additionally, the lower light blocking members 121c and 121d include respective portions, about 1.25 μm to about 2.5 μm wide, that do not overlap the data lines 171, which serve to prevent light leakage at the respective side edges of the data lines 171.

The ohmic contacts 161, 163 and 165 are interposed only between the underlying semiconductor stripes 151 and the overlying conductors 171, 175 and 179 thereon, and function to reduce the respective contact resistances therebetween.

A lower passivation layer 801 is formed on the data lines 171, the drain electrodes 175, an end portion 179 of data line 171 and the exposed semiconductor stripes 151. The passivation layer 180 is preferably made of an inorganic material, such as silicon nitride and silicon oxide, an organic insulator having photosensitivity, or a low dielectric constant material, such as a-Si:C:O and a-Si:O:F formed by plasma enhanced chemical vapor deposition (PECVD). The lower passivation layer 801 prevents external material from penetrating into the semiconductor stripes 151.

A plurality of color filters 230 are formed in alternating fashion on the lower passivation layer 801. The color filters 230 may include red, green, and blue color filters that extend substantially in the longitudinal direction and along the pixel rows in the areas enclosed by the data lines 171. A white color filter, preferably made of a transparent organic material, may also be formed along with the alternating red, green, and blue color filters. The color filters 230 are not formed on the end portions 129 and 179 of the gate lines 121 and the data lines 171 to allow contact to be made between the end portions and external circuits. Further, the edges of the color filters 230 overlap each other on the data lines 171. In this way, the overlapping portions of the color filters 230 function to prevent light leakage between the pixel areas.

An upper passivation layer 802 is formed on the color filters 230. The upper passivation layer 802 includes a plurality of contact holes 182 and 185 that expose the end portions 179 of the data lines 171 and the drain electrodes 175, respectively. Further, the upper and lower passivation layers 801 and 802 and the gate insulating layer 140 include a plurality of contact holes 181 that expose the end portions 129 of the gate lines 121, respectively.

A plurality of pixel electrodes 191 and a plurality of contact assistants 81 and 82 that are preferably made of a transparent conductive material, such as ITO or IZO, are formed on the upper passivation layer 802. Here, the upper passivation layer 802 prevents pigments of the color filters 230 from flowing into and contaminating the liquid crystal layer 3 of the display.

The pixel electrodes 191 are physically and electrically connected to the drain electrodes 175 through the contact holes 185, and data voltages are applied to the pixel electrodes 191 from the drain electrodes 175.

The contact assistants 81 and 82 are connected to the end portions 129 of the gate lines 121 and the end portions 179 of the data lines 171 through the contact holes 181 and 182, respectively.

In the embodiment described above, the lower light blocking members 121c and 121d connect two stems 121a and 121b of the gate lines 121, but the light blocking members 121c and 121d may also have branches that extend from one gate line 121, or alternatively, may be separated from the gate lines 121, so as to "float" relative thereto. Also, the lower light blocking members may be provided separately from the gate lines 121, to function as portions of storage electrode lines.

The common electrode panel 200 of the exemplary LCD is described in detail below in connection with FIG. 2. As illustrated in FIG. 2, a common electrode 270 is formed on an insulating substrate 210, and an upper light blocking member 220 is formed on the common electrode 270.

However, in an alternative embodiment, the common electrode 270 may be disposed on the upper light blocking member 220, and an overcoat for providing a flat surface may be formed between the insulating substrate 210 and the upper light blocking member 220 and common electrode 270.

As illustrated in FIG. 2, the common electrode panel 200 and the thin film transistor array panel 100 are disposed opposite to each other, such that the common electrode 270 of the common electrode panel 200 is disposed opposite to each pixel electrode 191 of the thin film transistor array panel 100. A layer 3 of a liquid crystal material including liquid crystal molecules is disposed between the two display panels 100 and 200.

The pixel electrodes 191, together with the common electrode 270, generate an electric field, thereby determining the orientation of the liquid crystal molecules of the liquid crystal layer 3 disposed between the two electrodes 191 and 270. The polarization of light that passes through the liquid crystal layer is changed according to the orientation of the liquid crystal molecules, which is determined as described above.

To improve the aperture ratio of the LCD, it is desirable to minimize the width of the upper light blocking member 220. However, if the width of the upper light blocking member 220 is decreased, light leakage may occur due to misalignment between the two display panels 100 and 200. In accordance with the present invention, however, a process margin is provided for the prevention of light leakage in the event of misalignment, and the gate metals that function as light blocking members are disposed below the data lines 171 for the prevention of deterioration of the color reproducibility. That is, the lower light blocking members 121c and 121d that comprise portions of the gate lines 121 are disposed below the data lines 171 and provide a light blocking function. However, when the lower light blocking members 121c and 121d comprise portions of the gate lines 121, the areas of overlap of the lower light blocking members 121c and 121d and the corresponding data lines 171 are increased, such that the parasitic capacitances Cgd described above are also increased, thereby increasing signal delay. Accordingly, in order to minimize the parasitic capacitances Cgd, it is necessary for the lower light blocking members 121c and 121d to be divided into two line portions so as to minimize the amount of overlap with the corresponding data lines 171.

Here, considering their function as light blocking members, and the high aperture ratio and misalignment margin desired, the maximum interval between the two lower light blocking members 121c and 121d must be about 3 μm with respect to the interval between the photosensitive film patterns for forming the lower light blocking members 121c and 121d (assuming a "wet-etch skew," discussed below, of about 0.5 μm on each respective edge thereof). When the interval between the two lower light blocking members 121c and 121d is increased, errors may occur, such as a deterioration of transmittance and light leakage due to the misalignment margin. Accordingly, a method for reducing the interval between the two lower light blocking members 121c and 121d is required to realize a COA (color filter on array) with a relatively high aperture ratio. The present invention provides such a method.

An exemplary embodiment of a method for manufacturing the thin film transistor array panel of the LCD is described below with reference to FIGS. 4 to 20, as well as FIGS. 1 to 3.

Figure 4:
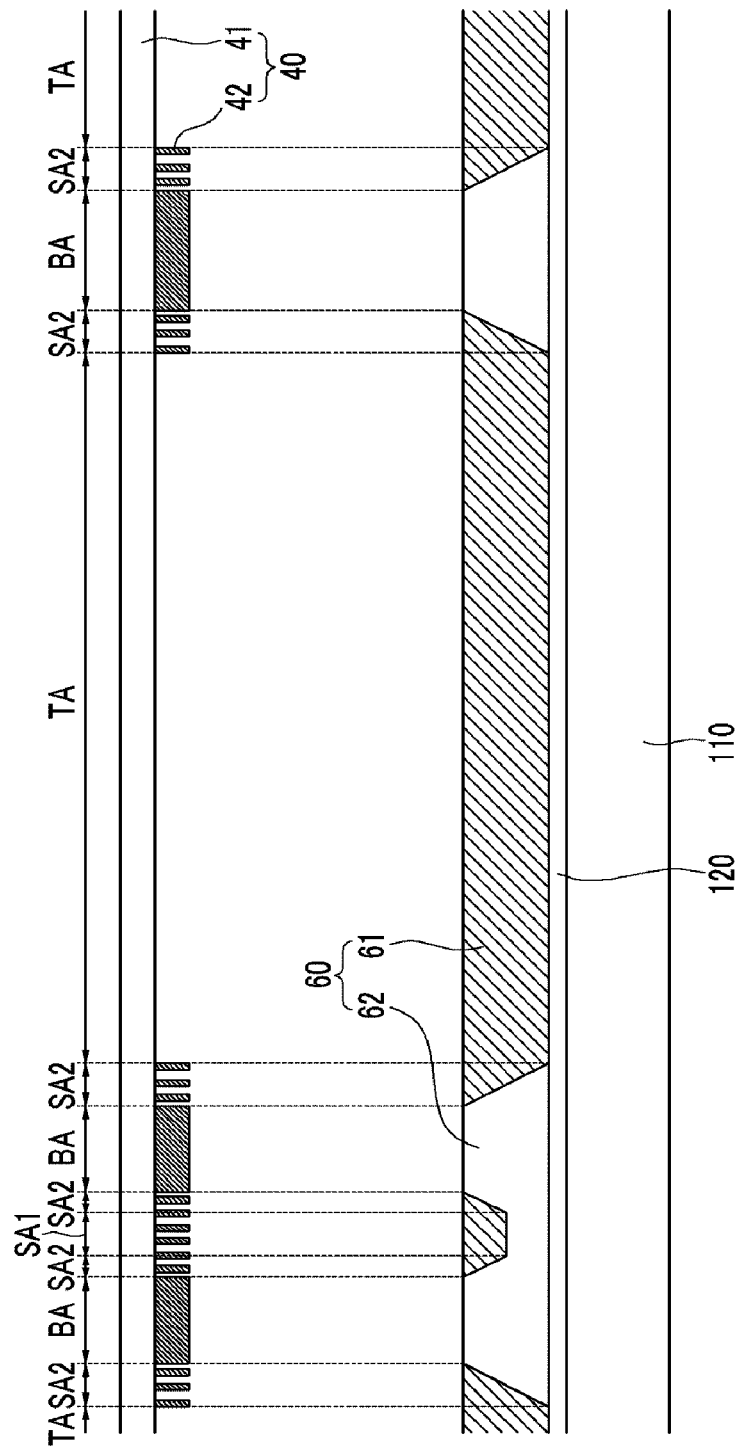
FIGS. 4 and 5 are partial cross-sectional views of the thin film transistor array panel of FIGS. 2 and 3, respectively, showing an intermediate stage of its manufacture in accordance with the present invention.
Figure 5:
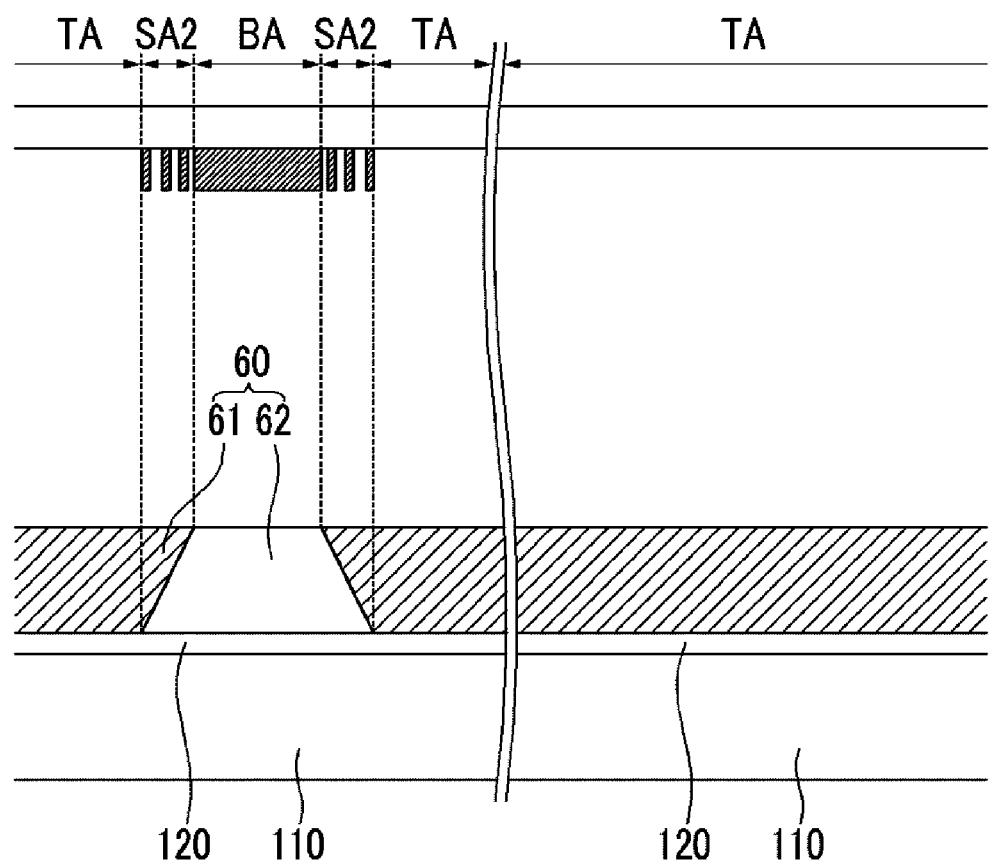
Figure 6:
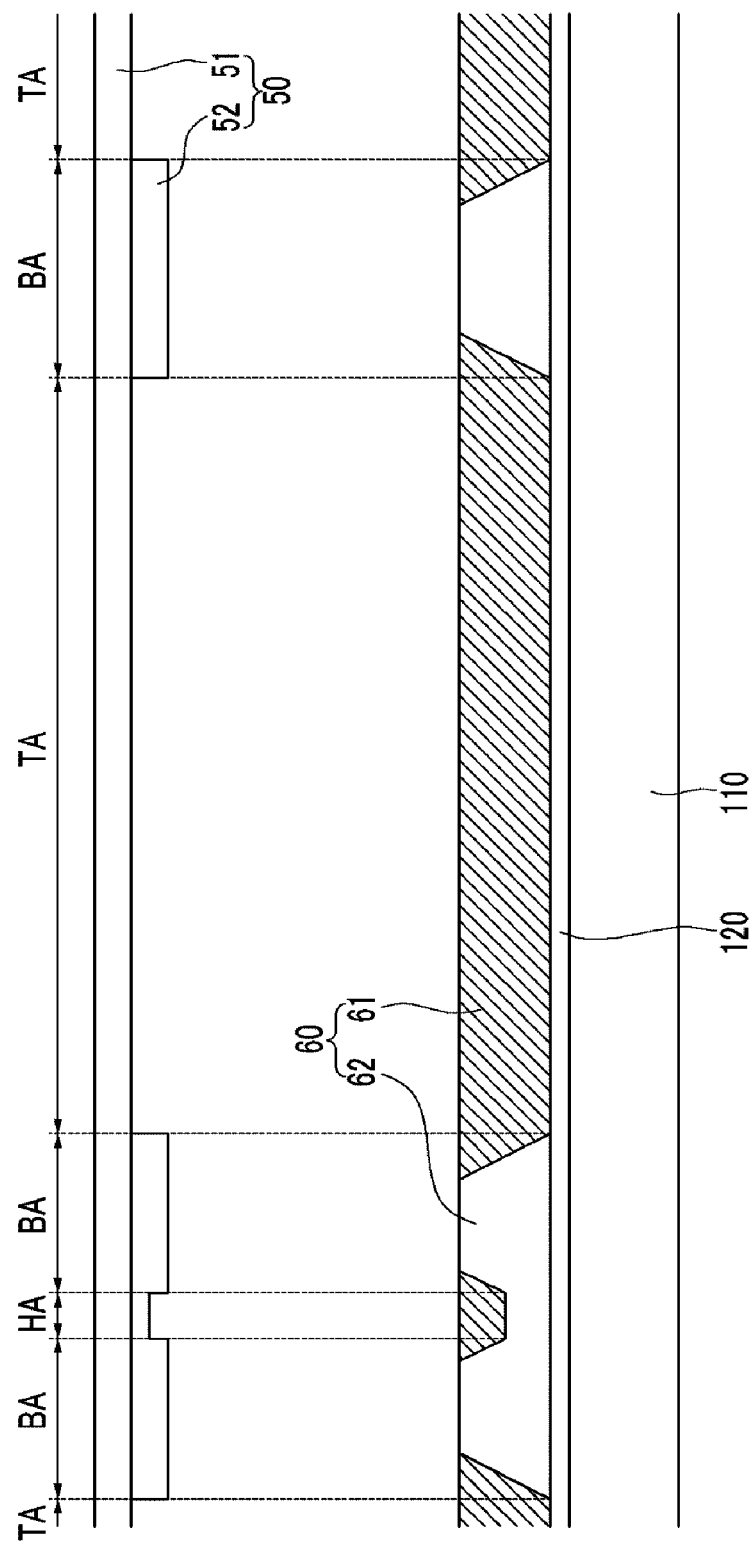
FIGS. 6 and 7 are partial cross-sectional views of an alternative embodiment of a thin film transistor array panel in accordance with the present invention, showing an intermediate stage of its manufacture corresponding to that illustrated in FIGS. 4 and 5, respectively.
Figure 7:
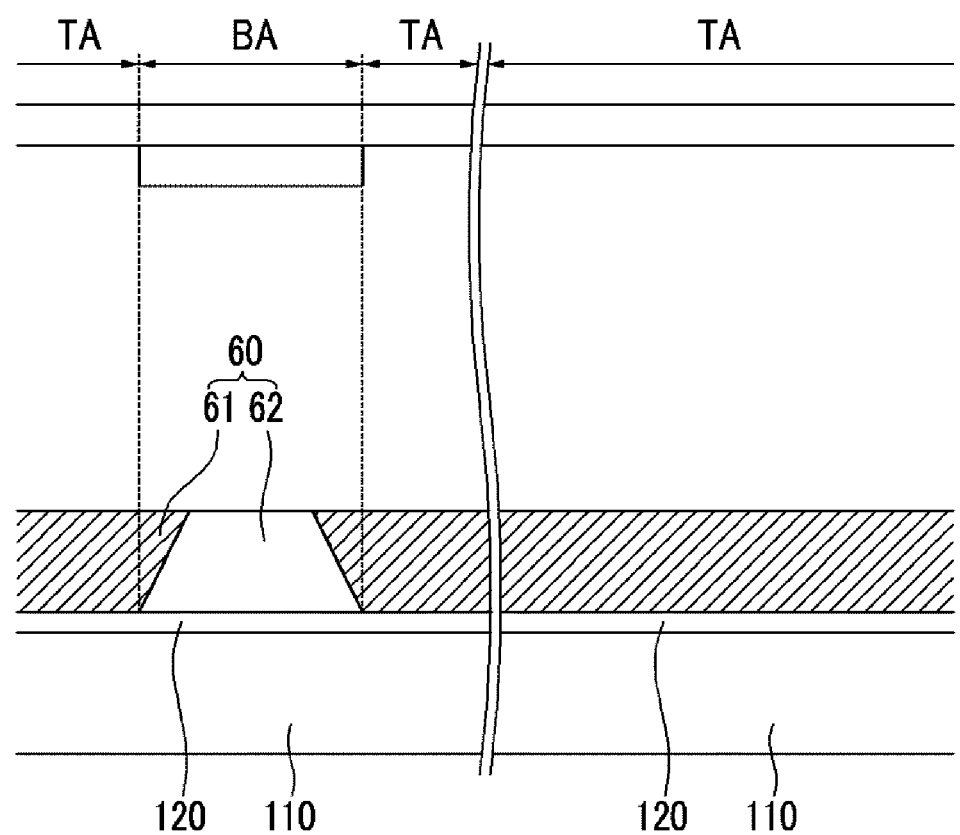
Figure 8:
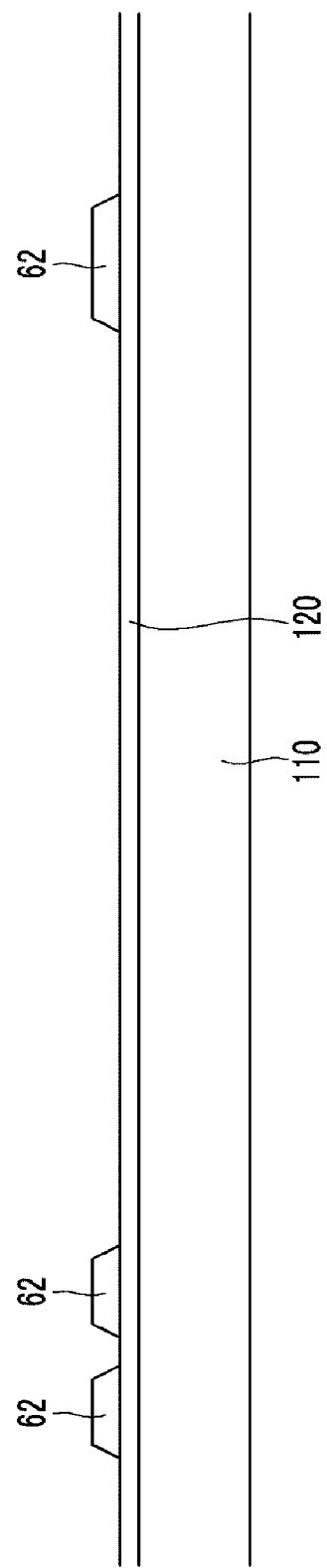
FIGS. 8 and 9 are partial cross-sectional views of the thin film transistor array panel of FIGS. 4 and 5, respectively, showing a subsequent stage in its manufacture.
Figure 9:
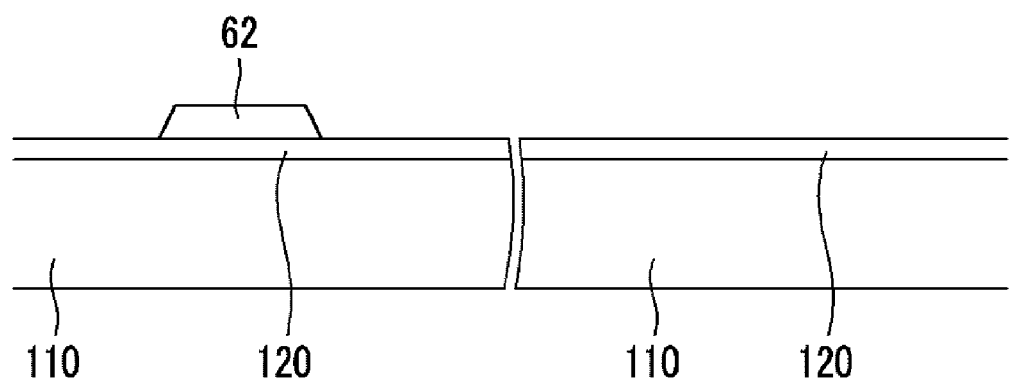
Figure 10:
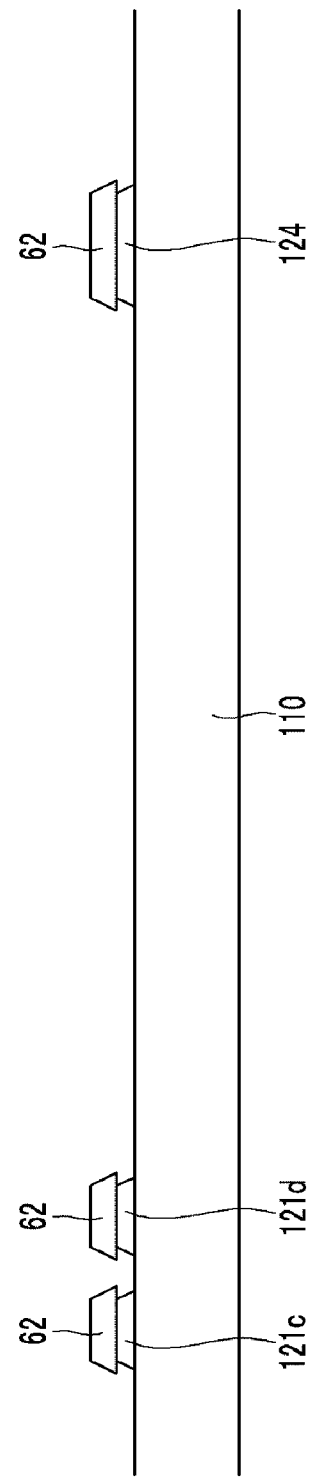
FIGS. 10 and 11 are partial cross-sectional views of the thin film transistor array panel of FIGS. 8 and 9, respectively, showing a subsequent stage in its manufacture.
Figure 11:
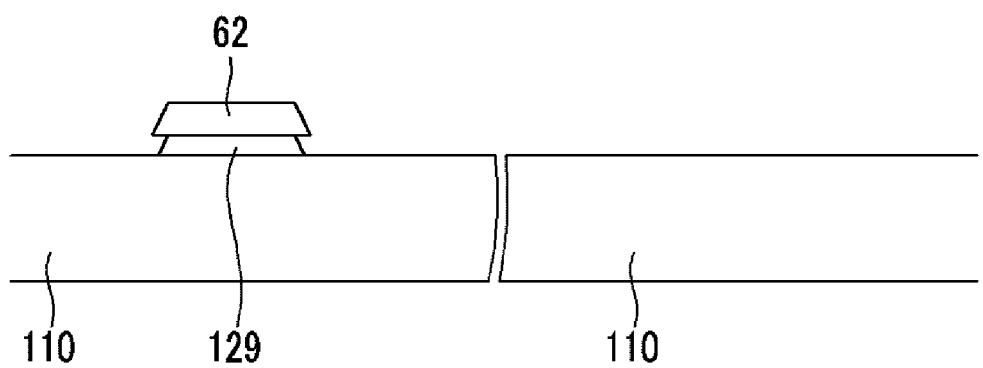
Figure 12:
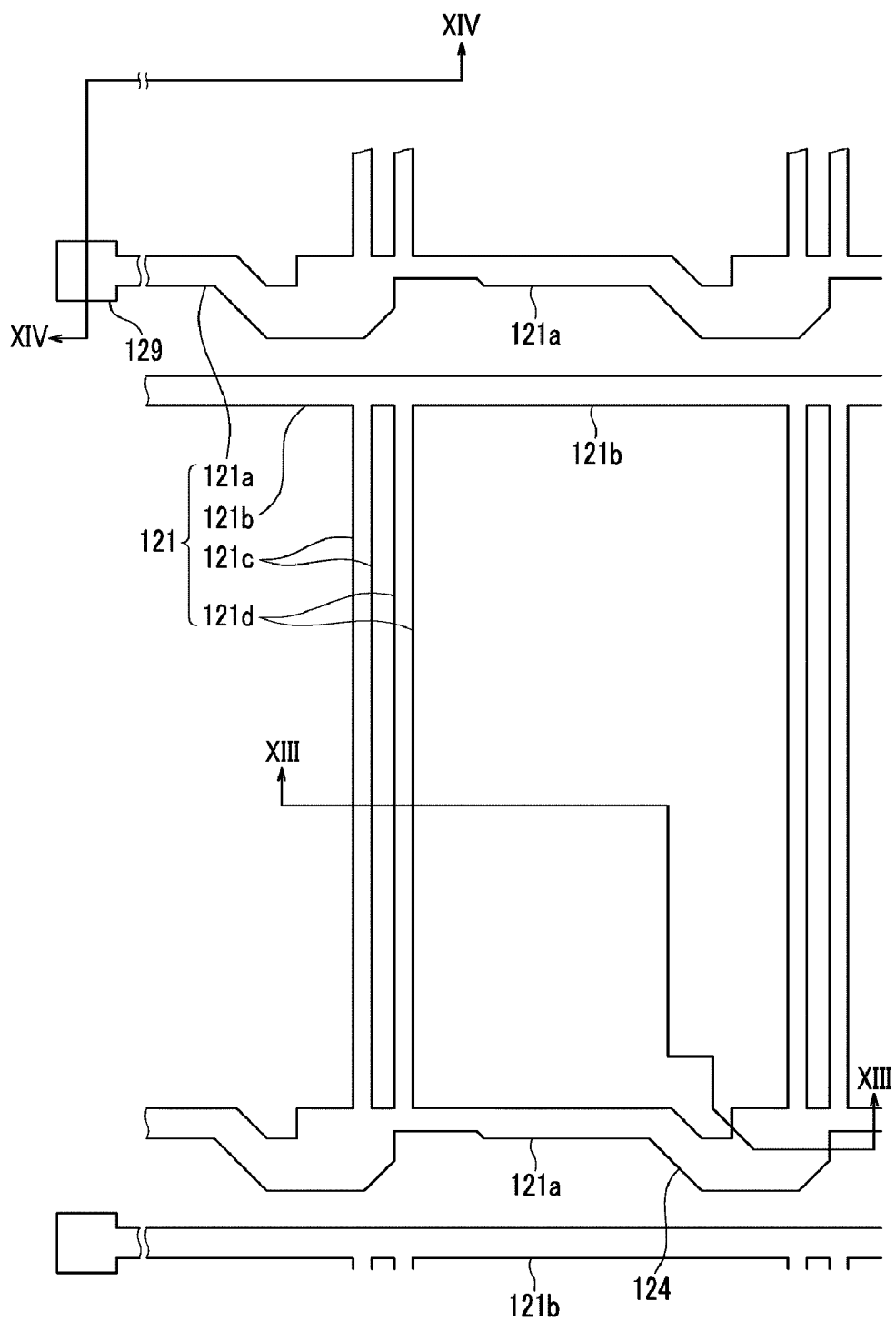
FIG. 12 is a partial top plan view of the thin film transistor array panel of FIG. 1, showing an intermediate stage of its manufacture in accordance with the present invention.
Figure 13:
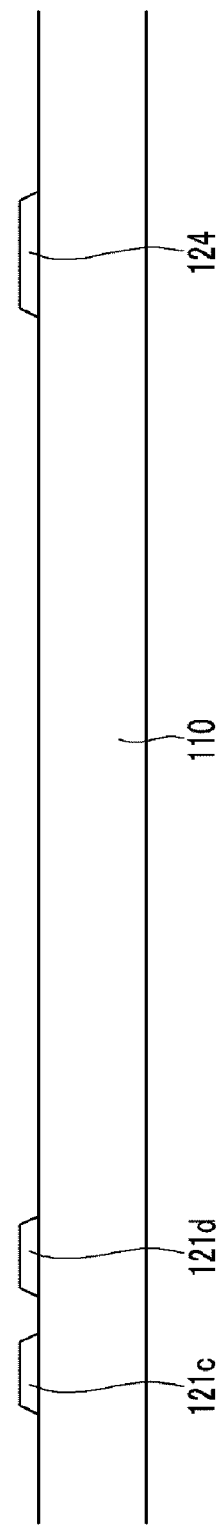
FIG. 13 is a partial cross-sectional view of the thin film transistor array panel of FIG. 12, as seen along the lines of the section XIII-XIII taken therein.
Figure 14:
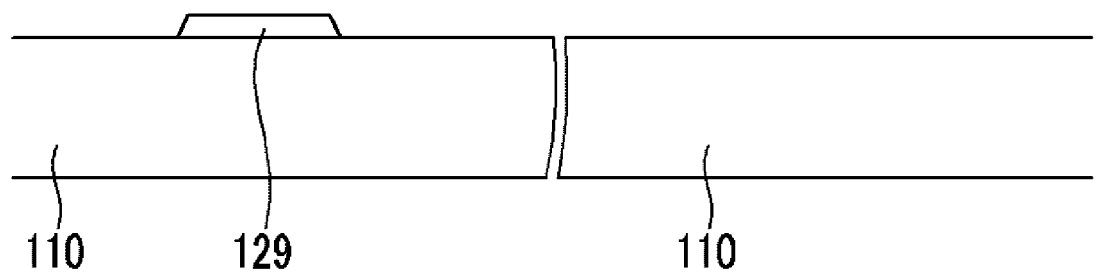
FIG. 14 is a partial cross-sectional view of the thin film transistor array panel of FIG. 12, as seen along the lines of the section XIV-XIV taken therein.
Figure 15:
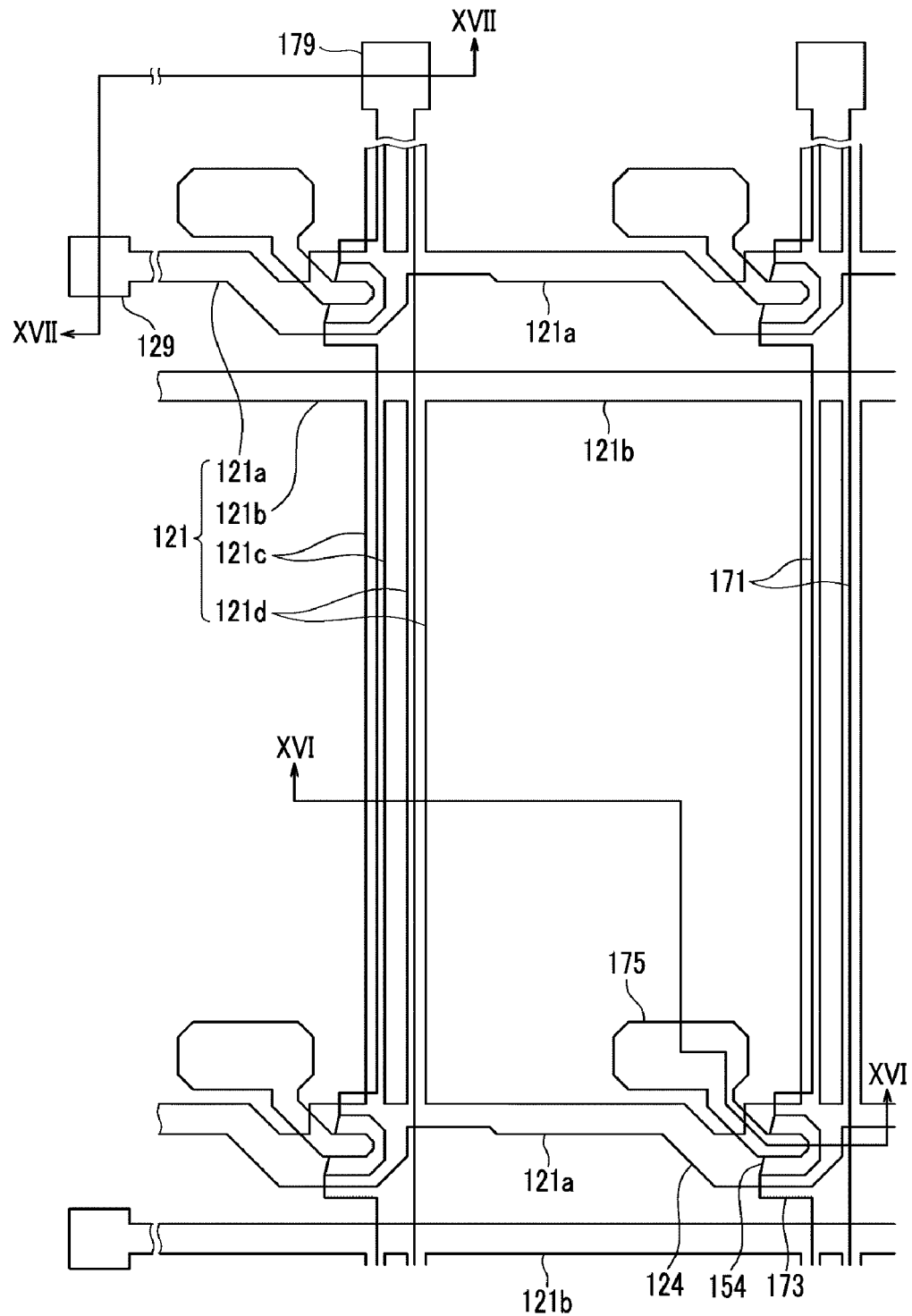
FIG. 15 is a partial top plan view of the thin film transistor array panel of FIG. 12, showing a subsequent stage of its manufacture.
Figure 16:
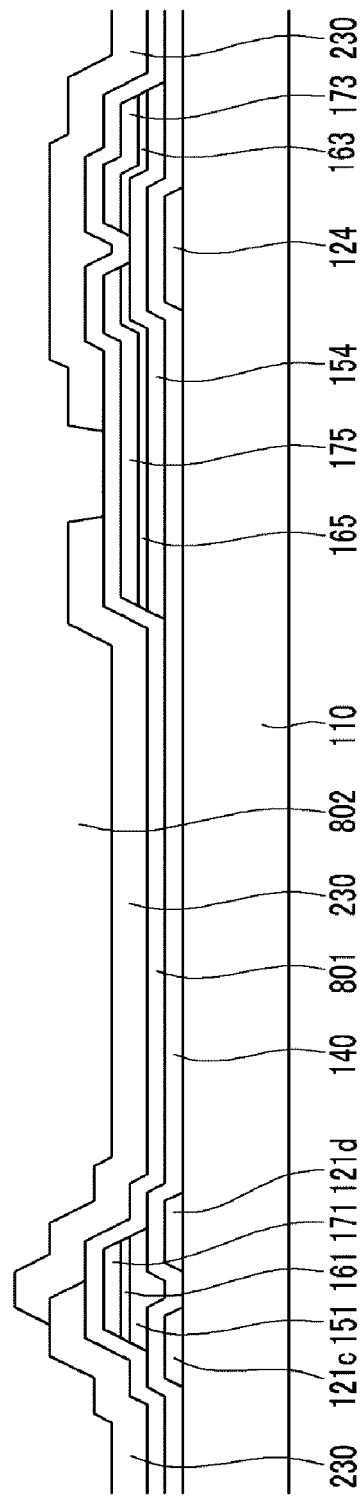
FIG. 16 is a partial cross-sectional view of the thin film transistor array panel of FIG. 15, as seen along the lines of the section XVI-XVI taken therein.
Figure 17:
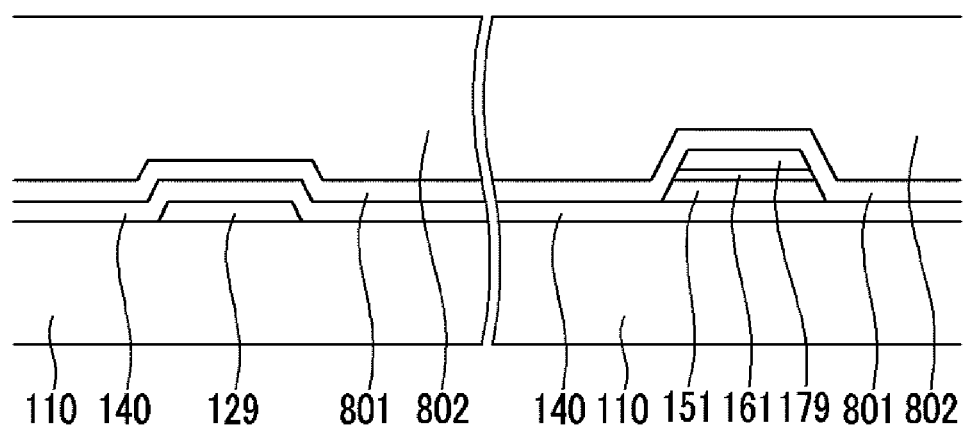
FIG. 17 is a partial cross-sectional view of the thin film transistor array panel of FIG. 15, as seen along the lines of the section XVII-XVII taken therein.
Figure 18:
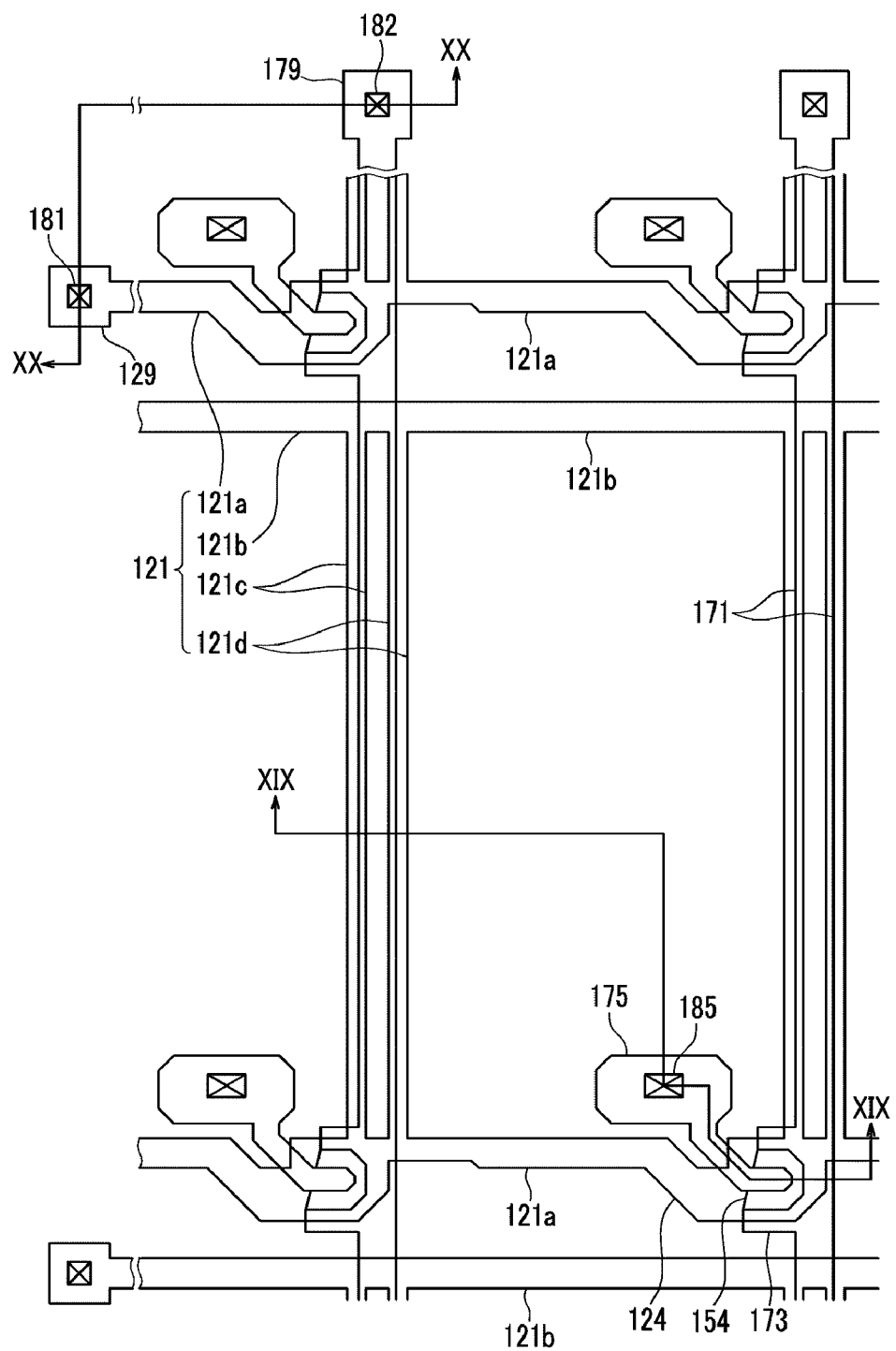
FIG. 18 a partial top plan view of the thin film transistor array panel of FIG. 15, showing a subsequent stage of its manufacture.
Figure 19:
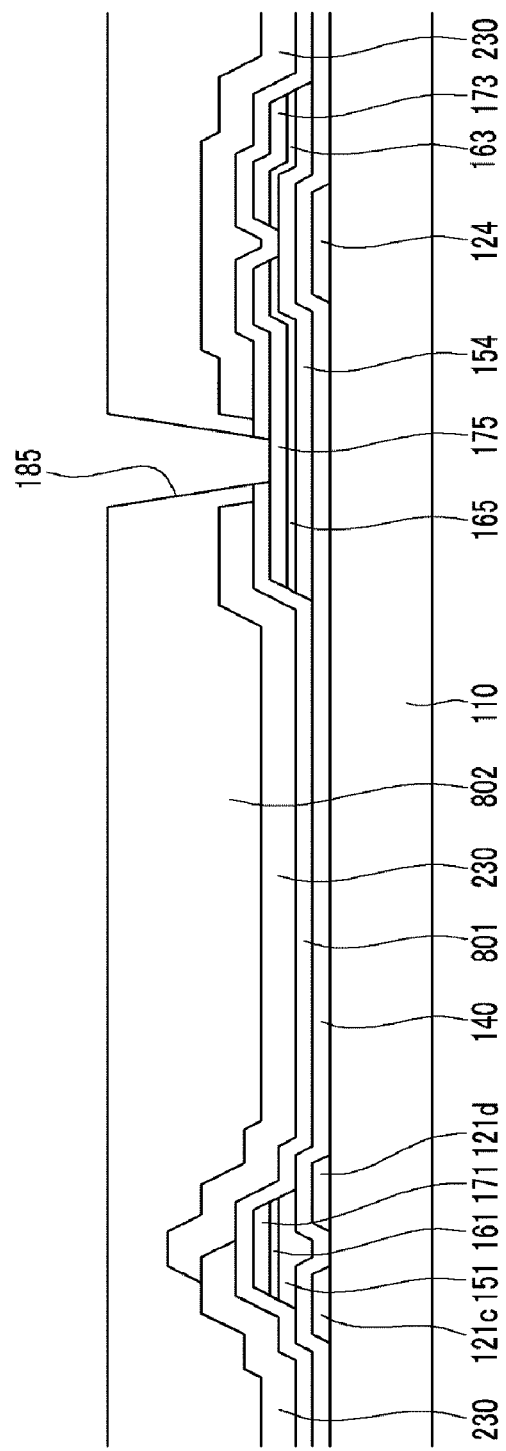
FIG. 19 a partial cross-sectional view of the thin film transistor array panel of FIG. 18, as seen along the lines of the section XIX-XIX taken therein.
Figure 20:
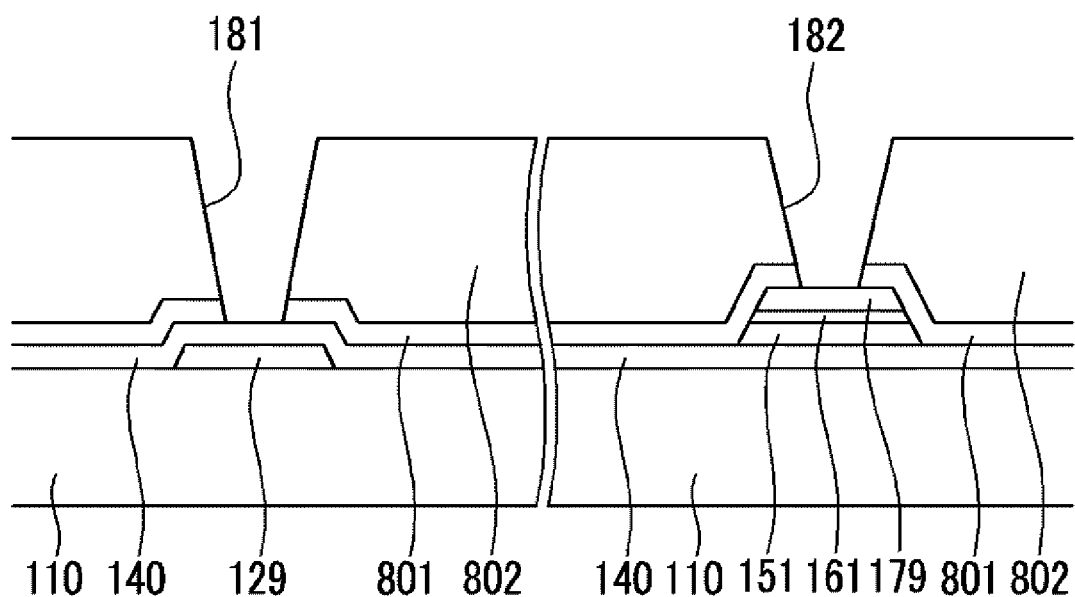
FIG. 20 is a partial cross-sectional view of the thin film transistor array panel of FIG. 18, as seen along the lines of the section XX-XX taken therein.

FIGS. 4 and 5 are partial cross-sectional views of the thin film transistor array panel of FIGS. 2 and 3, respectively, showing an intermediate stage of its manufacture. FIGS. 6 and 7 are partial cross-sectional views of an alternative exemplary embodiment of a thin film transistor array panel in an intermediate stage of manufacture corresponding to that illustrated in FIGS. 4 and 5, respectively. FIGS. 8 and 9 are partial cross-sectional views of the thin film transistor array panel of FIGS. 4 and 5, respectively, showing a subsequent stage in its manufacture. FIGS. 10 and 11 are partial cross-sectional views of the thin film transistor array panel of FIGS. 8 and 9, respectively, showing a subsequent stage in its manufacture. FIG. 12 is a partial top plan view of the thin film transistor array panel of FIG. 1, showing an intermediate stage of its manufacture in accordance with the present invention, and FIGS. 13 and 14 are partial cross-sectional view of the thin film transistor array panel of FIG. 12, as seen along the lines of the sections XIII-XIII and XIV-XIV taken therein, respectively. FIG. 15 is a partial top plan view of the thin film transistor array panel of FIG. 12, showing a subsequent stage of its manufacture. FIGS. 16 and 17 are partial cross-sectional views of the thin film transistor array panel of FIG. 15, as seen along the lines of the sections XVI-XVI and XVII-XVII taken therein, respectively. FIG. 18 a partial top plan view of the thin film transistor array panel of FIG. 15, showing a subsequent stage of its manufacture, and FIGS. 19 and 20 are partial cross-sectional views of the thin film transistor array panel of FIG. 18, as seen along the lines of the sections XIX-XIX and XX-XX taken therein, respectively.

Referring to FIGS. 4 and 5, a metal layer 120 is formed on an insulating substrate 110 made of a transparent material, such as glass, and a photosensitive film 60 is formed on the metal layer 120.

A light mask 40 is then aligned with the photosensitive film 60. The light mask 40 includes a transparent substrate 41 and an opaque light blocking layer 42 disposed thereon, and is divided into a light blocking region BA, a light transmitting region TA, a first slit (translucent) region SA1, and a second slit (translucent) region SA2.

The light blocking layer 42 is present on the light blocking region BA, the first slit region SA1, and the second slit region SA2, and is not present on the light transmitting region TA.

The light blocking layer 42 is disposed on the entire surface of the light blocking region BA, has slits of a uniform width having a predetermined value in the first translucent region SA1, and has slits of varying widths in the second translucent region SA2.

The second slit region SA2 is disposed between the light blocking region BA and the first slit region SA1, and between the light blocking region BA and the light transmitting region TA. Here, the respective widths of the slits of the second slit region SA2 increase gradually in proportion to their respective distances from the first slit region SA1 and the light transmitting region TA, and their respective widths decrease gradually in proportion to their respective distances from the light blocking region BA.

After irradiating light passes from an exposer (not illustrated) through the light mask 40 to expose the photosensitive film 60, and the photosensitive film 60 is then developed, the part of the photosensitive film 60 that was exposed to light of more than a predetermined intensity is removed. Specifically, the part of the photosensitive film 60 that was disposed opposite to the light blocking region BA remains, and the part that was disposed opposite to the light transmission region TA is entirely removed. The thickness of the part of the photosensitive film 60 corresponding to the second slit region SA2 is tapered, from a highest point corresponding to the light blocking region BA, to the surface of the part corresponding to the first slit region SA1 and the light transmitting region TA. Thus, as illustrated in FIGS. 4 and 5, the hatched portion 61 of the photosensitive film 60 is removed after the film is developed, and the remaining portion 62 of the photosensitive film 60 remains in place after the film is developed.

However, as illustrated in FIGS. 6 and 7, the first and second slit regions SA1 and SA2 can be replaced by a translucent region HA in the photosensitive film 60 exposure process. The light blocking layer 42 at the translucent region HA is thinner than the light blocking layer 42 at the light blocking region BA, and the amount of light passing through the translucent region HA is greater than the amount of light passing through the light blocking region BA, but less than the amount of light passing through the light transmitting region TA. The light blocking layer 42 of the translucent region HA is preferably made of a metal, such as chromium.

Further, the division arrangements of the first and second slit regions SA1 and SA2 can be replaced by disposing a light transmitting region having a single slit with a width that is less than the resolution of the light exposer between two light blocking regions BA.

In FIGS. 6 and 7, the hatched portion 61 indicates the part of the photosensitive film 60 that is removed after developing, and the remaining portion 62 indicates the part of the photosensitive film 60 that remains after developing.

As illustrated in FIGS. 8 and 9, after conclusion of the developing process, the photosensitive film 62 is etched back by ashing to remove the part of the photosensitive film 62 corresponding to the first slit region SA1 until the metal layer 120 is exposed. Here, the width of the metal layer 120 that is exposed through the removal of the photosensitive film 62 by the etch-back process is less than 4 µm, which is smaller in size than the resolution of the light exposer. That is, for a given resolution of the light exposer, a pattern interval that otherwise could not be successfully formed may be successfully formed by adopting an exposure method that uses slits or translucent regions (hereinafter referred to as a "half-tone exposure method") and the etch-back method described above. As a result, the width of the metal layer 120 exposed between the photosensitive film patterns 62 may be decreased to as little as about 1 µm, but in the present exemplary embodiment, is decreased to about 1.5 µm. Also, the width of the photosensitive film 62 that remains on the portion where the lower light blocking members 121c and 121d are to be formed may be less than 4 µm, which again, is less than the resolution of the light exposer. The width of the photosensitive film 62 that remains on the portions where the lower light blocking members 121c and 121d are to be formed can thus be controlled in accordance with the desired aperture ratio and light leakage considerations, which, in the present exemplary embodiment, is controlled to be about 3.5 µm.

Next, as illustrated in FIG. 10 and FIG. 11, the metal layer 120 is etched by using the photo-sensitive film 62, which has a thickness reduced through the etch-back process, as an etch mask. The etching of the metal layer 120 may comprise a wet etching process, and in this case, the portion of the metal layer 120 that is disposed below the photosensitive film 62 is etched through anisotropic wet etching such that a plurality of gate lines 121, including the light blocking members 121c and 121d, are formed with widths that are less than the width of the photosensitive film 62. In this way, i.e., when the width of the photosensitive film is less than the width of the pattern because of the wet etching (the difference between the widths being referred to as a "wet-etch skew"), the wet-etch skew can be controlled by changes to the etch conditions, such as etch time. However, the generation of some wet-etch skew is inevitable, and the conditions for generating a skew of about a total of 0.5 µm on both edges of the lower light blocking members 121c and 121d is used in the present exemplary embodiment. Accordingly, the lower light blocking members 121c and 121d may be formed to have respective widths of about 3 µm, and the interval between the lower light blocking members 121c and 121d may be formed to have a width of about 2 µm. When a dry etching process is used, no significant amount of skew is generated, and the interval between the lower light blocking members 121c and 121d may be about 1.5 µm.

Next, as illustrated in FIGS. 12 to 14, the remaining photosensitive film 62 on the gate lines 121, including the stems 121a and 121b, the lower light blocking members 121c and 121d, and the gate electrodes 124, is removed.

Table 1 below summarizes certain of the parameters of the etch process described above, including the width of the photosensitive film 62 after the etch-back process, the width of the lower light blocking members 121c and 121d, and the interval between the lower light blocking members 121c and 121d. The thickness T of the photosensitive film 62 corresponding to the first slit region SA1 or the translucent region HA is in the range of from 2000 Å to 4000 Å after the exposure and developing processes, and the lower light blocking members 121c and 121d are formed by using the photo-sensitive film 62 as an etch mask. Here, the width of the photosensitive film 62 is the width of the photosensitive film patterns 62 disposed on the region where the lower light blocking members 121c and 121d will be formed.

TABLE 1

| Parameter | Case 1 | Case 2 |
| --- | --- | --- |
| Photosensitive film developing time | 35 seconds | 45 seconds |
| Width A of photosensitive film after etch-back process | 4.163 µm | 4.115 µm |
| Interval between adjacent photosensitive films | 1.134 µm | 1.247 µm |
| Respective widths of lower light blocking members | 3.432 µm | 2.944 µm |
| Interval between adjacent lower light blocking members | 2.006 µm | 2.400 µm |

As shown in Table 1, when the photosensitive film 62 corresponding to the first slit region SA1 (or the translucent region HA) has a thickness T of from 2000 Å to 4000 Å, and the photosensitive film 62 is wet etched for 35 seconds, the width of the adjacent photo-sensitive film patterns 62 is about 4.163 µm and the interval between the adjacent photosensitive film patterns 62 is about 1.134 µm. When the metal layer 120 is then etched using the photosensitive film patterns 62 as an etch mask, the corresponding adjacent lower light blocking members 121c and 121d have respective widths of 3.432 µm, and are spaced apart from and parallel to each other with an interval of 2.006 µm therebetween.

FIG. 22 is an electron microscopy picture illustrating the two exemplary cases of the etching processes summarized in Table 1, after both the etch-back and wet etch processes.

As may be seen in Table 1 and FIG. 22, when the photosensitive film 62 corresponding to the first slit region SA1 (or the translucent region HA) has a thickness T of from 2000 Å to 4000 Å, and the photosensitive film 62 is etched for 45 seconds, the adjacent photosensitive film patterns 62 have a width of 4.115 µm and the adjacent photosensitive film patterns 62 have an interval of 1.247 µm therebetween. When the metal layer 120 is etched by using the photosensitive film patterns 62 as an etch mask, the corresponding adjacent lower light blocking members 121c and 121d have respective widths of 2.944 µm, and are spaced apart from and parallel to each other with an interval of 2.400 µm therebetween.

As described above, adjacent light blocking members 121c and 121d may be formed with an interval of less than 3 µm therebetween by using the exposure, developing, and etching of the photosensitive film method of the present invention. That is to say, the conventional method's interval between the signal lines of more than 4 µm can be reduced to less than 4 µm by the methods of the present invention. Accordingly, the interval between two lower light blocking members 121c and 121d can be reduced such that light leakage caused by a gap between the data line 171 and the lower light blocking members 121c and 121d is prevented, even though there is some misalignment between the thin films, and simultaneously, the light blocking members 121c and 121d can be formed with an interval of less than the resolution of the light exposer, thereby improving the aperture ratio of the display.

Next, as illustrated in FIGS. 15 to 17, an amorphous silicon layer, a doped amorphous silicon layer, and a data layer are deposited, and a photosensitive film is formed on the data layer. The data layer, the doped amorphous silicon layer, and the amorphous silicon layer are then patterned, using the photosensitive film as an etch mask, to form a plurality of data lines 171, including source electrodes 173 and end portions 179, a plurality of drain electrodes 175, a plurality of ohmic contacts 161, 163 and 165, and a plurality of semiconductor stripes 151.

Here, the respective edges of the data lines 171 overlap the corresponding lower light blocking members 121c and 121d such that the capacitor Cgd is formed. As discussed above, the capacitance of the capacitor Cgd increases proportionally with an increase in the area of overlap of the data lines 171 and the lower light blocking member 121c and 121d, and this capacitance may cause an undesirable delay of the signals of the display device.

However, in accordance with the present invention, because the two lower light blocking members 121c and 121d that are spaced apart by about 1.5 µm to about 4 µm respectively overlap both edges of the data lines 171 with overlap widths of from bout 1.25 µm to about 2.5 µm, the parasitic capacitance Cgd generated by the overlap of the data line 171 and the lower light blocking members 121c and 121d is minimized such that signal delay is prevented, and simultaneously, the leakage of light is prevented, even though there may be some misalignment between the signal lines. Accordingly, signal delay of the display device due to parasitic capacitances Cgd is prevented, and deterioration of the quality of the display due to the light leakage is also prevented.

The ohmic contacts 161, 163 and 165 exist only between the semiconductor stripes 151 and the data lines 171 and drain electrodes 175 to reduce contact resistance therebetween.

Next, a lower passivation layer 801, preferably made of an organic material having photosensitive characteristics, an insulating material with a lower dielectric constant, or an inorganic material, is formed on the gate lines 121, the data lines 171, and the insulating substrate 110. Next, photosensitive organic materials having red, green, and blue pigments are respectively sequentially coated on the lower passivation layer 801, and patterned using a photolithography process to form red, green, and blue color filters 230. Here, the color filters 230 extend in a direction parallel to the data lines 171 and are alternately disposed on the pixel row, and the edges of the color filters 230 overlap each other above the data lines 171. The lower passivation layer 801 protects the semiconductor stripes 151 from being contaminated with the pigments of the color filters 230.

Next, an upper passivation layer 802, preferably made of a photosensitive organic material, is formed on the color filters 230.

Next, as illustrated in FIGS. 18 to 20, the upper passivation layer 802, along with the lower passivation layer 801 and the gate insulating layer 140, is patterned with an etch process using a photosensitive film as an etch mask to form a plurality of contact holes 182 and 185 exposing the end portions 179 of the data lines 171 and the drain electrodes 175, and a plurality of contact holes 181 exposing the end portions 129 of the gate lines 121.

Next, as illustrated in FIGS. 1 to 3, a plurality of pixel electrodes 191 electrically connected to the drain electrodes 175, and a plurality of contact assistants 81 and 82 electrically connected to end portions 129 and 179 of the gate lines 121 and the data lines 171, respectively, are formed on the upper passivation layer 802. These are preferably made of ITO or IZO.

Figure 21:
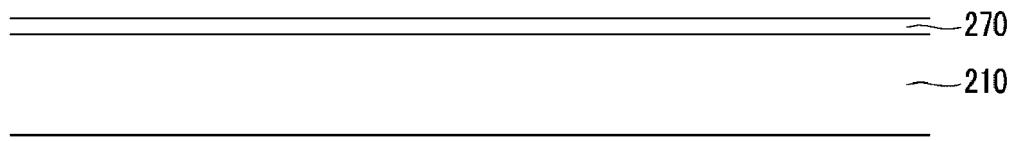
FIG. 21 is a partial cross-sectional view of the common electrode panel of FIG. 2, showing an intermediate stage its manufacture in accordance with the present invention.

An exemplary embodiment of a method for manufacturing the common electrode panel 200 of the LCD of FIG. 2 will now be described with reference to FIG. 21, which is a partial cross-sectional view of the common electrode panel, showing an intermediate stage of its manufacture in accordance with the present invention;

As illustrated in FIG. 21, a common electrode 270 is formed on an insulating substrate 210.

Next, as illustrated in FIG. 2, an upper light blocking member 220 is formed on the common electrode 270. In an alternative embodiment, the common electrode 270 may be formed on the upper light blocking member 220, and an overcoat (not illustrated) having a flat surface may be formed on the common electrode 270 and the upper light blocking member 220.

The upper light blocking member 220 includes portions corresponding the gate lines 121, the data lines 171 and the thin film transistors, and prevents light leakage between the pixel electrodes 191. Here, the upper light blocking member 220 is disposed opposite to the lower light blocking members 121c and 121d that are respectively disposed on opposite side edges of a corresponding data line 171, and which respectively include one edge that overlaps an edge of the data line 171, and another edge that does not overlap the data line 171, and which is disposed parallel to the pixel electrode 191 to prevent the leakage of light.

As discussed above, if the width of the lower light blocking members 121c and 121d disposed on the peripheral edges of the data line 171 is formed with a minimum value for the prevention of light leakage, and the interval between two lower light blocking members 121c and 121d is formed with a minimum value for minimizing the parasitic capacitances Cgd, the width of the upper light blocking member 220 can be minimized in accordance with the width and the interval of the lower light blocking members 121c and 121d. Accordingly, the aperture ratio of the LCD can be improved such that the cost of the light source used as a backlight can be correspondingly reduced and the color reproducibility of the display improved.

Figure 23:
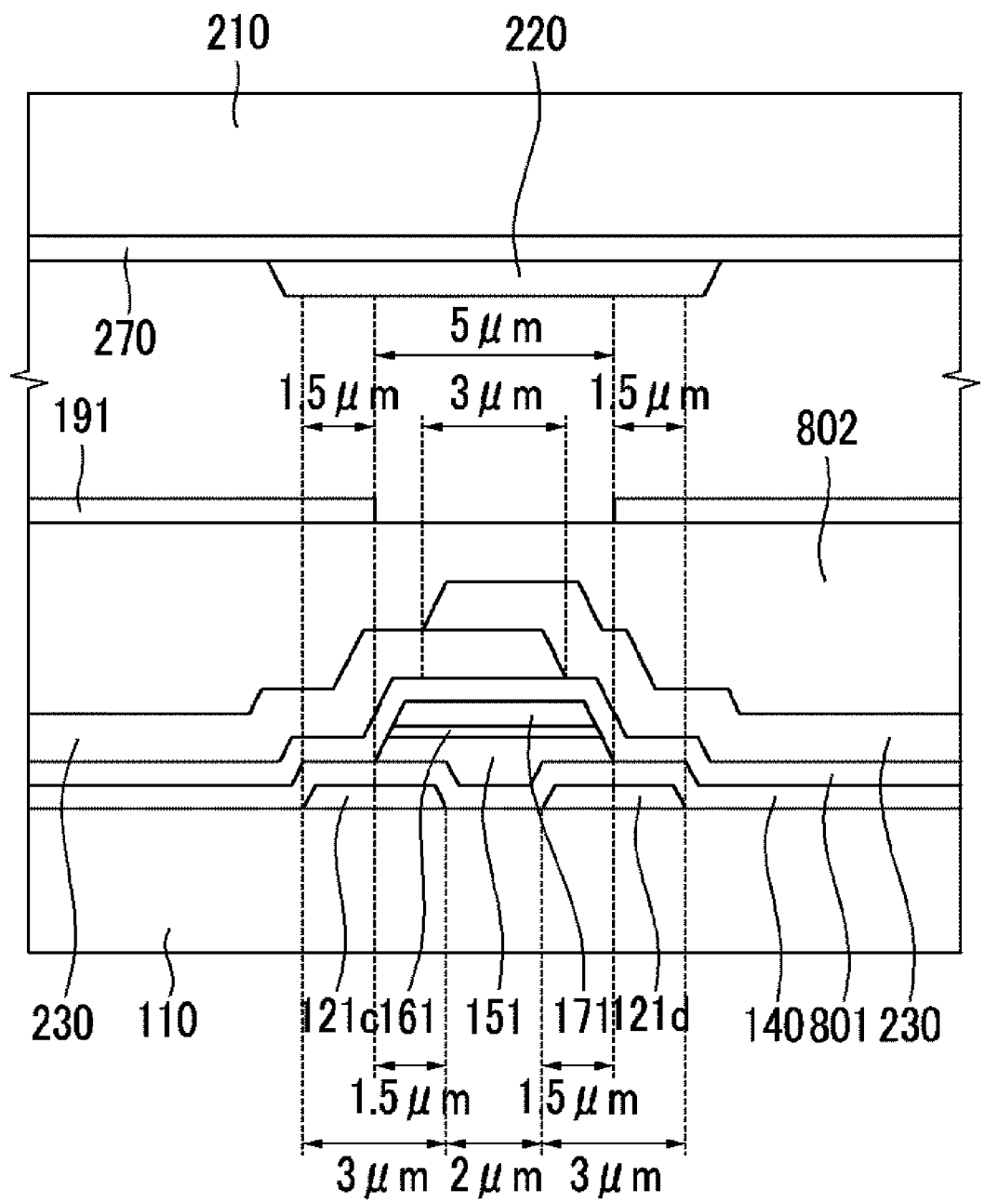

The improvement of the aperture ratio of the LCD according to an exemplary embodiment of the present invention is described in detail below with reference to FIG. 23. As illustrated in FIG. 23, a halftone exposure method and an etch-back method as described above are used to form the lower light blocking members 121c and 121d with respective widths of about 3 μm and with an interval between them of about 2 μm, for a total width of about 8 μm. Accordingly, the upper light blocking member 220 may be formed with a width that is slightly greater (about 9 μm) than the total width of the light blocking members. Compared with the present invention, when lower light blocking members 121c and 121d are formed using a conventional photolithography process, the minimum width of the lower light blocking members 121c and 121d is about 3.5 μm, and the minimum interval between two lower light blocking members 121c and 121d is about 4.5 μm, which is a function of the limit of resolution of the light exposer. Accordingly, the upper light blocking member 220 is formed with a greater width (about 12.5 μm) than the sum of 11.5 μm of the widths of and the interval between the conventionally formed lower light blocking members 121c and 121d. Accordingly, by using the techniques of the present invention, the width of the upper light blocking member 220 can be reduced by 30%.

To minimize the width and the interval of the upper light blocking members 121c and 121d, exposure equipment having a high resolution may be used. However, the cost for such exposure equipment and the cost for replacement of the exposure equipment are remarkably high. In addition, a light source of the exposure equipment may include a light source emitting a light of g-line, h-line or i-line, and excimer laser.

According to the present invention, the lower light blocking members 121c and 121d are spaced apart from both edges of the data line 171 with a width of more than 1.5 μm and less than 4 μm such that leakage of light is prevented and the aperture ratio is improved.

In this description, a COA (color filter array) type of LCD is described by way of example, but it should be understood that the present invention is not limited to such LCD types, but may be adapted to other types of flat panel displays, such as electrophoretic displays.

Additionally, although the present invention has been described and illustrated with reference to certain exemplary embodiments thereof, it should be understood by those of skill in this art that a variety of modifications and variations may be made to the present invention without departing from its spirit and scope as defined by the claims appended hereafter and their functional equivalents

What is claimed is:

1. A method for manufacturing a thin film transistor array panel, the method comprising:
   forming a metal layer on a substrate;
   coating a photosensitive film on the metal layer;
   exposing and developing the photosensitive film by using a predetermined light mask to form a first photosensitive film pattern including a first portion, a second portion thinner than the first portion, and a third portion thinner than the second portion;
   removing the thinner portions of the second and third portions by etching back the first photosensitive film pattern to form a secondary photosensitive film pattern exposing a portion of the metal layer below the second and third portions; and,
   etching the metal layer using the secondary photosensitive film pattern as an etch mask to form first and second light blocking members that are parallel to and spaced apart from each other, with a predetermined interval therebetween.

2. The method of claim 1, wherein the width of the exposed portion of the secondary photosensitive film pattern formed by the removal of the second portion of the first photosensitive film is in a range of from more than 1 μm to less than 4 μm.

3. The method of claim 2, wherein the predetermined light mask for the formation of the first photosensitive film pattern includes a light blocking region, a light transmitting region, and a translucent region.

4. The method of claim 3, wherein the translucent region includes a first slit region and a second slit region, the width of the slits of the first slit region being uniform, and the respective widths of the slits of the second slit region gradually increasing in proportion to the respective distances of the slits from the light blocking region.

5. The method of claim 4, wherein the interval between the first and second light blocking members is in a range of from more than 1.5 μm to less than 4 μm, and the respective widths of the first and second light blocking members is in a range of from about 2.5 μm to about 5 μm.

6. The method of claim 5, further comprising:
   forming a first insulating layer on the first light blocking member and the second light blocking member;

forming a data line partially overlapping the first light blocking member and the second light blocking member on the first insulating layer;

forming a second insulating layer on the data line; and, forming a color filter on the second insulating layer.

7. The method of claim 1, wherein the interval between the first and second light blocking members is in a range of from more than 1.5 µm to less than 4 µm, and the respective widths of the first and second light blocking members is in a range of from about 2.5 µm to about 5 µm.

8. The method of claim 7, further comprising:

forming a first insulating layer on the first light blocking member and the second light blocking member;

forming a data line partially overlapping the first light blocking member and the second light blocking member on the first insulating layer;

forming a second insulating layer on the data line; and, forming a color filter on the second insulating layer.

9. The method of claim 1, further comprising:

forming a first insulating layer on the first light blocking member and the second light blocking member;

forming a data line partially overlapping the first light blocking member and the second light blocking member on the first insulating layer;

forming a second insulating layer on the data line; and, forming a color filter on the second insulating layer.

10. The method of claim 1, a distance between the first and second light blocking members is narrower than a resolution of an exposure equipment used for forming the first and second light blocking members.

11. A method for manufacturing a thin film transistor array panel, the method comprising:

forming a metal layer on a substrate;

coating a photosensitive film on the metal layer;

exposing and developing the photosensitive film by using a predetermined light mask to form a first photosensitive film pattern including a first portion and a second portion thinner than the first portion and partially exposing the metal layer;

etching back the first photosensitive film pattern to remove the second portion and to form a second photosensitive film pattern exposing the portion of the metal layer below the second portion;

etching the metal layer by using the secondary photosensitive film pattern as an etch mask to form a first light blocking member, a second light blocking member, and a gate line, wherein the first light blocking member and the second light blocking member are disposed parallel to each other with a predetermined interval therebetween;

forming a gate insulating layer on the gate line;

forming a semiconductor on the gate insulating layer;

forming a data line on the semiconductor, the data line having edges partially overlapping the first light blocking member and the second light blocking member;

forming a first passivation layer on the data line;

forming a color filter on the first passivation layer;

forming a second passivation layer on the color filter; and, forming a pixel electrode on the second passivation layer.

* * * * *